(12) United States Patent
Shin et al.

(10) Patent No.: US 9,508,635 B2
(45) Date of Patent: Nov. 29, 2016

(54) METHODS OF FORMING CONDUCTIVE JUMPER TRACES

(71) Applicant: STATS ChipPAC, Ltd., Singapore (SG)

(72) Inventors: HanGil Shin, Gyeonggi-do (KR); HeeJo Chi, Kyoungki-do (KR); NamJu Cho, Gyeonggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 161 days.

(21) Appl. No.: 13/929,775

(22) Filed: Jun. 27, 2013

(65) Prior Publication Data
US 2015/0004748 A1    Jan. 1, 2015

(51) Int. Cl.
| | |
|---|---|
| H01L 21/00 | (2006.01) |
| H01L 23/498 | (2006.01) |
| H01L 21/48 | (2006.01) |
| H05K 3/46 | (2006.01) |
| H01L 23/00 | (2006.01) |
| H01L 21/56 | (2006.01) |
| H05K 1/09 | (2006.01) |
| H05K 3/12 | (2006.01) |

(52) U.S. Cl.
CPC ..... *H01L 23/49838* (2013.01); *H01L 21/4867* (2013.01); *H01L 24/49* (2013.01); *H05K 3/1283* (2013.01); *H05K 3/4685* (2013.01); *H01L 21/561* (2013.01); *H01L 23/49894* (2013.01); *H01L 24/48* (2013.01); *H01L 2224/05553* (2013.01); *H01L 2224/2919* (2013.01); *H01L 2224/32225* (2013.01); *H01L 2224/48229* (2013.01); *H01L 2224/4917* (2013.01); *H01L 2224/49173* (2013.01); *H01L 2224/49176* (2013.01); *H01L 2224/49179* (2013.01); *H01L 2224/73265* (2013.01); *H01L 2924/00014* (2013.01); *H01L 2924/01322* (2013.01); *H01L 2924/12041* (2013.01); *H01L 2924/12042* (2013.01); *H01L 2924/13091* (2013.01); *H01L 2924/181* (2013.01); *H05K 1/092* (2013.01); *H05K 3/125* (2013.01); *H05K 2201/026* (2013.01); *H05K 2201/0323* (2013.01); *H05K 2203/095* (2013.01); *H05K 2203/1194* (2013.01)

(58) Field of Classification Search
CPC .............................................. H01L 2224/45144
See application file for complete search history.

(56) References Cited

U.S. PATENT DOCUMENTS

| | | | |
|---|---|---|---|
| 4,636,754 A | 1/1987 | Presser et al. | |
| 5,753,970 A | 5/1998 | Rostoker | |
| 6,010,769 A * | 1/2000 | Sasaoka | H01L 21/4857 174/262 |
| 6,060,778 A * | 5/2000 | Jeong | H01L 23/13 257/697 |
| 6,064,116 A * | 5/2000 | Akram | H01L 23/3677 257/700 |
| 6,108,210 A | 8/2000 | Chung | |

(Continued)

*Primary Examiner* — Telly Green
*Assistant Examiner* — Andre' C Stevenson
(74) *Attorney, Agent, or Firm* — Robert D. Atkins; Patent Law Group: Atkins and Associates, P.C.

(57) ABSTRACT

Methods of forming conductive jumper traces for semiconductor devices and packages. Substrate is provided having first, second and third trace lines formed thereon, where the first trace line is between the second and third trace lines. The first trace line can be isolated with a covering layer. A conductive layer can be formed between the second and third trace lines and over the first trace line by a depositing process followed by a heating process to alter the chemical properties of the conductive layer. The resulting conductive layer is able to conform to the covering layer and serve to provide electrical connection between the second and third trace lines.

23 Claims, 13 Drawing Sheets

(56) References Cited

U.S. PATENT DOCUMENTS

| | | |
|---|---|---|
| 6,429,515 B1 | 8/2002 | Glenn |
| 6,740,821 B1 * | 5/2004 | Jiang .................... H05K 1/0293 174/257 |
| 6,830,778 B1 | 12/2004 | Schulz et al. |
| 6,835,889 B2 * | 12/2004 | Hiraoka .................. H01C 7/00 174/521 |
| 7,061,125 B2 | 6/2006 | Cho et al. |
| 7,638,861 B2 | 12/2009 | Choi et al. |
| 7,979,789 B2 | 7/2011 | Ammerlaan et al. |
| 8,093,721 B2 | 1/2012 | Kang et al. |
| 8,288,210 B2 | 10/2012 | Lee et al. |
| 8,318,540 B2 | 11/2012 | Beer |
| 8,334,464 B2 | 12/2012 | Edwards et al. |
| 8,362,612 B1 | 1/2013 | Paek et al. |
| 8,404,520 B1 | 3/2013 | Chau et al. |
| RE44,251 E * | 6/2013 | Asai ..................... H05K 1/0271 174/260 |
| 9,041,472 B2 * | 5/2015 | Chen ........................ H03F 3/19 330/307 |

* cited by examiner

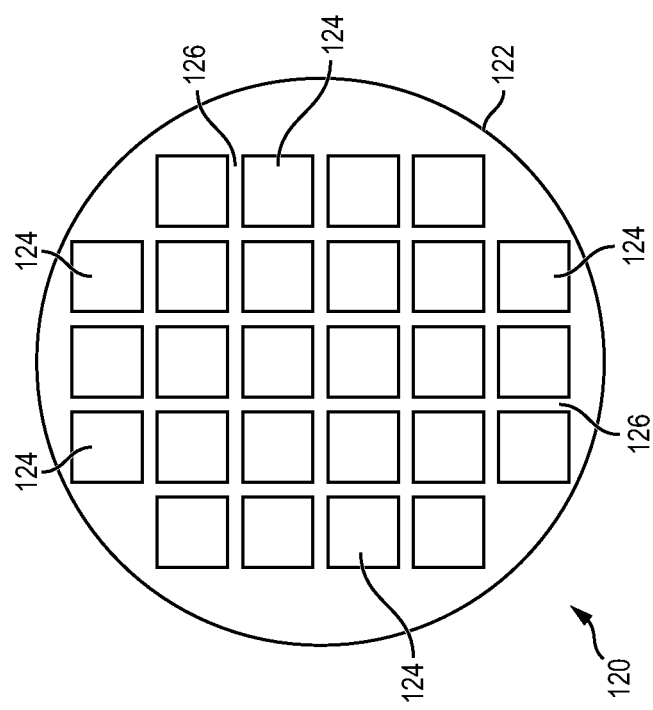
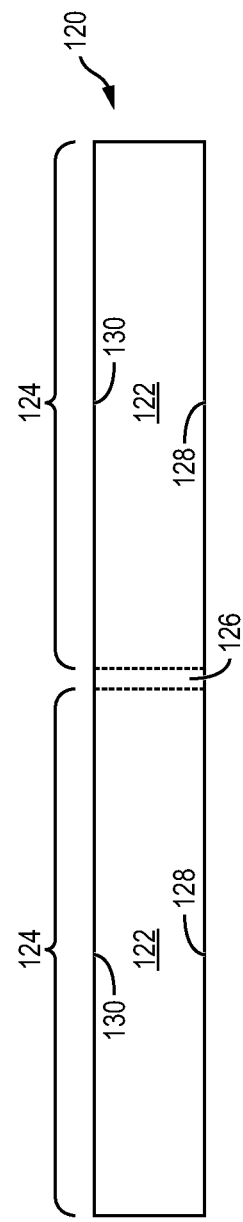
FIG. 3a
FIG. 3b

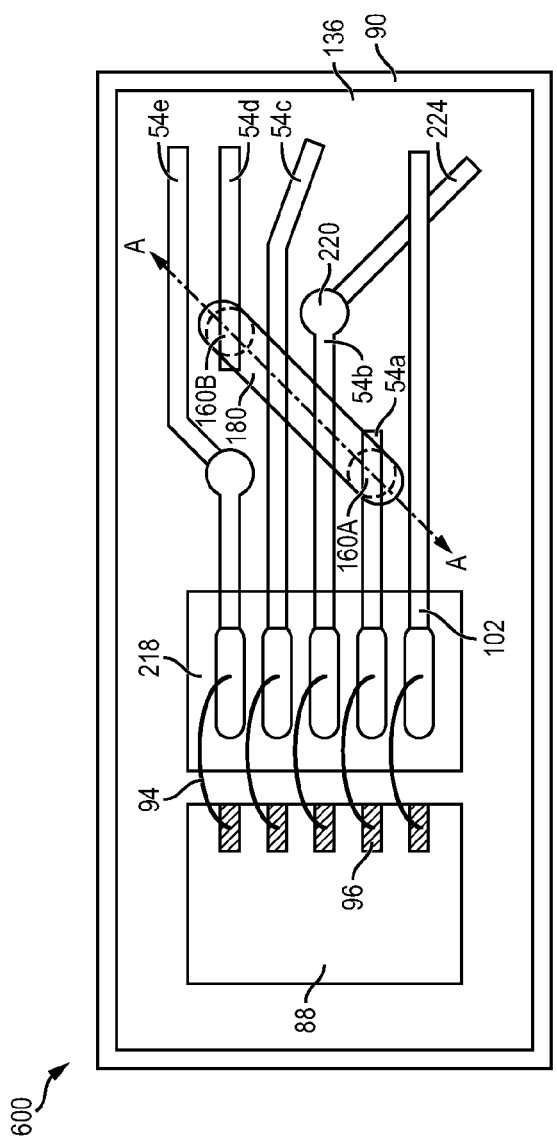
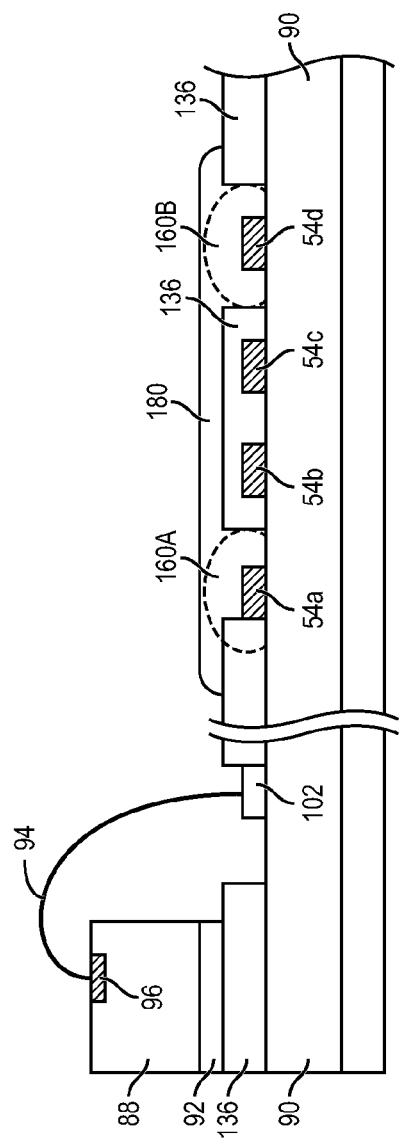
FIG. 10a
FIG. 10b

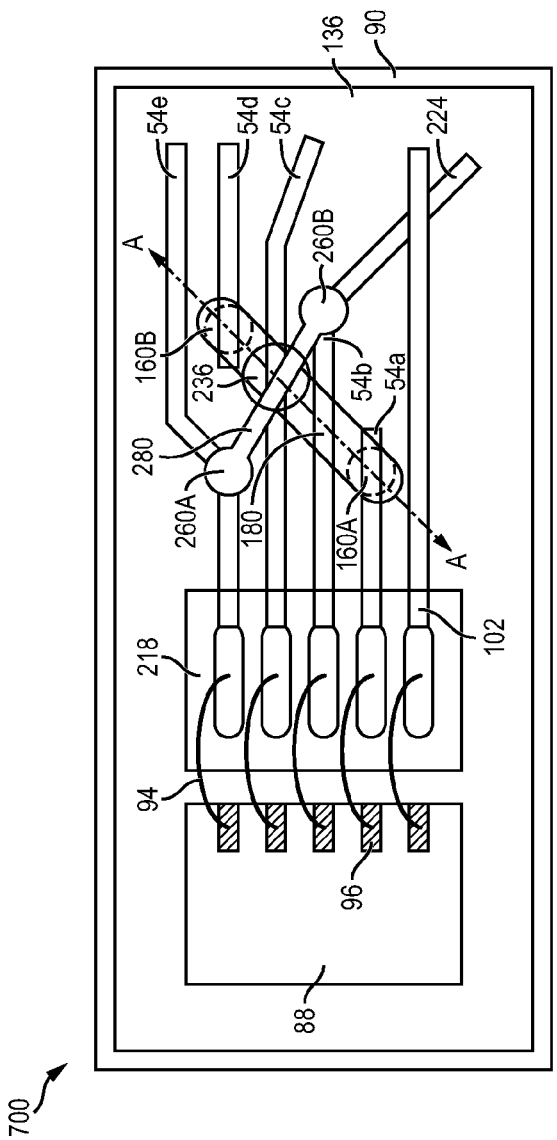
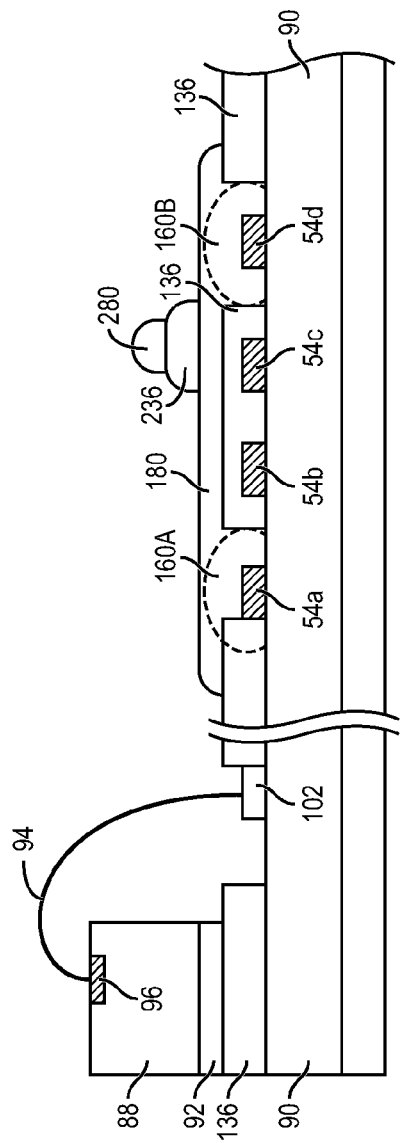
FIG. 12a
FIG. 12b

METHODS OF FORMING CONDUCTIVE JUMPER TRACES

TECHNICAL FIELD

The present disclosure relates in general to semiconductor devices, more particularly, to methods of forming conductive jumper traces for semiconductor devices and packages.

BACKGROUND

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

SUMMARY

Methods of forming conductive jumper traces for semiconductor devices and packages. In one embodiment, a method of forming conductive jumper traces for semiconductor devices and packages includes: (a) providing a substrate and (b) forming first, second and third trace lines over the substrate, where the first trace line is between the second trace line and the third trace line. Next, the method includes: (c) isolating the first trace line with a covering layer and (d) forming a conductive layer between the second trace line and the third trace line. The forming step (d) includes the following sub-steps: (i) depositing the conductive layer having a first state and (ii) heating the conductive layer from the first state to a second state, where the second state is different than the first state. The resulting conductive layer is able to conform to the covering layer and operable to provide electrical connection between the second trace line and the third trace line.

In one embodiment, the forming step (b) further includes forming a fourth trace line over the substrate, where the fourth trace line is adjacent the first trace line and between the second trace line and the third trace line. In another embodiment, the isolating step (c) includes isolating the fourth trace line with the covering layer. In one embodiment, the method further includes: mounting an integrated circuit die over the substrate, where the integrated circuit die is adjacent at least one of the second trace line and the third trace line, and coupling the integrated circuit die to at least one of the second trace line and the third trace line with a connective material. The connective material allows the integrated circuit die to be in communication with the at least one of the second trace line and the third trace line. In one embodiment, the mounting step and the coupling step can be performed at the same time as the forming step (b) or after the forming step (b). In one embodiment, the depositing step (i) of the forming step (d) includes depositing the conductive layer including at least one of silver (Ag), platinum (Pt), gold (Au), copper (Cu), carbon nanotube (CNT), graphene, organic metal, and mixtures thereof. In another embodiment, the method further includes treating the second trace line and the third trace line with hydrophilic plasma prior to the forming step (d).

In one embodiment, a method of forming conductive jumper traces for semiconductor devices and packages includes: (a) providing a substrate and (b) forming first, second, third and fourth trace lines over the substrate, where the first trace line is adjacent the fourth trace line and both lines are in between the second trace line and the third trace line. Next, the method includes: (c) isolating the first trace line and the fourth trace line with a covering layer and (d) forming a conductive layer between the second trace line and the third trace line. The forming step (d) includes the following sub-steps: (i) depositing the conductive layer having a first state and (ii) heating the conductive layer from the first state to a second state, the second state different than the first state. The resulting conductive layer is able to conform to the covering layer and operable to provide electrical connection between the second trace line and the third trace line.

In one embodiment, the method further includes: mounting an integrated circuit die over the substrate, where the integrated circuit die is adjacent at least one of the second trace line and the third trace line, and coupling the integrated circuit die to at least one of the second trace line and the third trace line with a connective material. The connective material allows the integrated circuit die to be in communication with the at least one of the second trace line and the third trace line. In one embodiment, the mounting step and the coupling step can be performed at the same time as the forming step (b) or after the forming step (b). In one embodiment, the depositing step (i) of the forming step (d) includes depositing the conductive layer including at least one of silver (Ag), platinum (Pt), gold (Au), copper (Cu), carbon nanotube (CNT), graphene, organic metal, and mixtures thereof. In another embodiment, the method further includes treating the second trace line and the third trace line with hydrophilic plasma prior to the forming step (d).

In one embodiment, a method of forming conductive jumper traces for semiconductor devices and packages includes: (a) providing a substrate, and (b) forming first, second and third trace lines over the substrate, where the first trace line is between the second trace line and the third trace line. Next, the method includes: (c) isolating a portion of the first trace line with a first covering layer, and (d) forming a first conductive layer between the second trace line and the third trace line. The forming step (d) includes the following sub-steps: (i) depositing the first conductive layer having a first state and (ii) heating the first conductive layer from the first state to a second state, where the second state is different than the first state. The resulting conductive layer is able to conform to the first covering layer and operable to provide electrical connection between the second trace line and the third trace line. Next, the method includes: (e) isolating a portion of the first conductive layer with a second covering layer and (f) forming a second conductive layer over the second covering layer. The forming step (f) includes the following sub-steps: (i) depositing the second conductive layer having a third state and (ii) heating the second conductive layer from the third state to a fourth state, where the fourth state is different than the third state. The resulting second conductive layer is able to conform to the second covering layer.

In one embodiment, the forming step (b) further includes forming a fourth trace line over the substrate, where the fourth trace line is adjacent the first trace line and between the second trace line and the third trace line. In another embodiment, the isolating step (c) includes isolating a portion of the fourth trace line with the first covering layer. In yet another embodiment, the forming step (b) further includes: forming a fourth trace line over the substrate, and connecting the second conductive layer from the fourth trace line and at least one of the first trace line, the second trace line and the third trace line. In one embodiment, the method further includes: mounting an integrated circuit die over the substrate, where the integrated circuit die is adjacent at least one of the second trace line and the third trace line, and coupling the integrated circuit die to at least one of the second trace line and the third trace line with a connective material. The connective material allows the integrated circuit die to be in communication with the at least one of the second trace line and the third trace line.

In one embodiment, the mounting step and the coupling step can be performed at the same time as the forming step (b) or after the forming step (b). In another embodiment, the depositing step (i) of the forming step (d) includes depositing the first conductive layer including at least one of silver (Ag), platinum (Pt), gold (Au), copper (Cu), carbon nanotube (CNT), graphene, organic metal, and mixtures thereof, and the depositing step (i) of the forming step (f) includes depositing the second conductive layer including at least one of silver (Ag), platinum (Pt), gold (Au), copper (Cu), carbon nanotube (CNT), graphene, organic metal, and mixtures thereof. In yet another embodiment, the method further includes treating the second trace line and the third trace line with first hydrophilic plasma prior to the forming step (d), and treating the second covering layer with second hydrophilic plasma prior to the forming step (f).

Other variations, embodiments and features of the present disclosure will become evident from the following detailed description, drawings and claims.

BRIEF DESCRIPTION OF THE DRAWINGS

FIGS. 3a-3b illustrate details of a representative semiconductor substrate.

FIGS. 7A-7B to 10A-10B are top-down and cross-sectional views of a process flow for forming the semiconductor package of FIGS. 6A-6B.

FIGS. 11A-11B to 12A-12B are top-down and cross-sectional views of a process flow for forming a semiconductor package having a conductive jumper trace according to another embodiment of the present disclosure.

DETAILED DESCRIPTION OF THE DISCLOSURE

Figure 1:
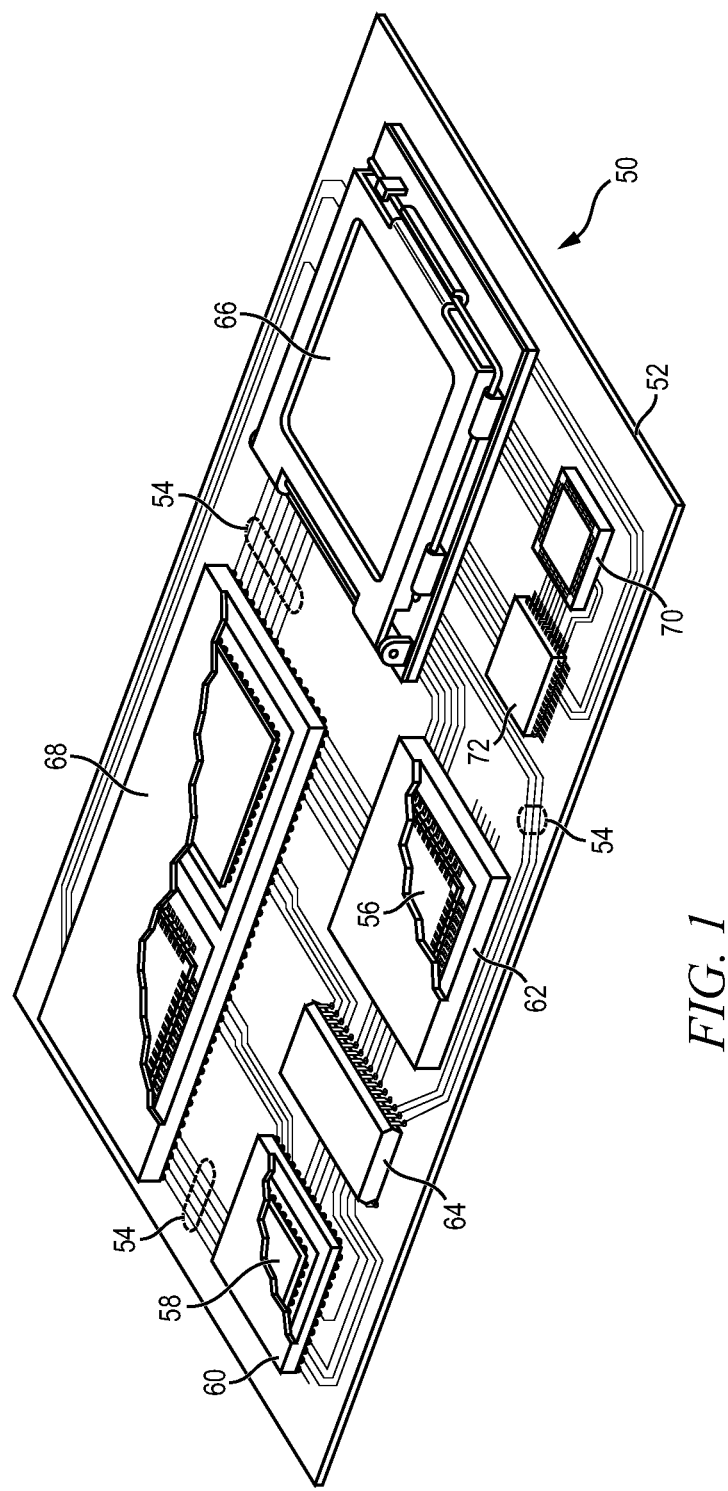
FIG. 1 illustrates a printed circuit board (PCB) with different types of packages mounted to its surface.

It will be appreciated by those of ordinary skill in the art that the embodiments disclosed herein can be embodied in other specific forms without departing from the spirit or essential character thereof. The presently disclosed embodiments are therefore considered in all respects to be illustrative and not restrictive.

The present disclosure is described in one or more embodiments in the following description with reference to the figures, in which like numerals represent the same or similar elements. While the disclosure is described in terms of the best mode for achieving the disclosure's objectives, it will be appreciated by those skilled in the art that it is intended to cover alternatives, modifications, and equivalents as may be included within the spirit and scope of the disclosure as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, i.e., the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
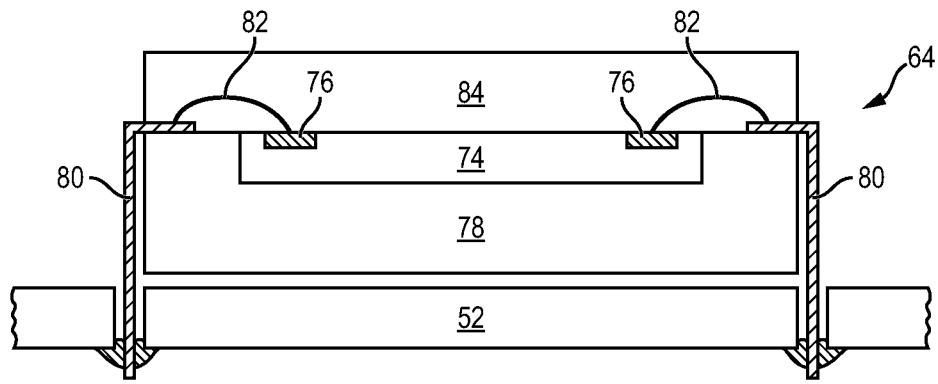
FIGS. 2a-2c illustrate further detail of the representative semiconductor packages mounted to the PCB.
Figure 2B:
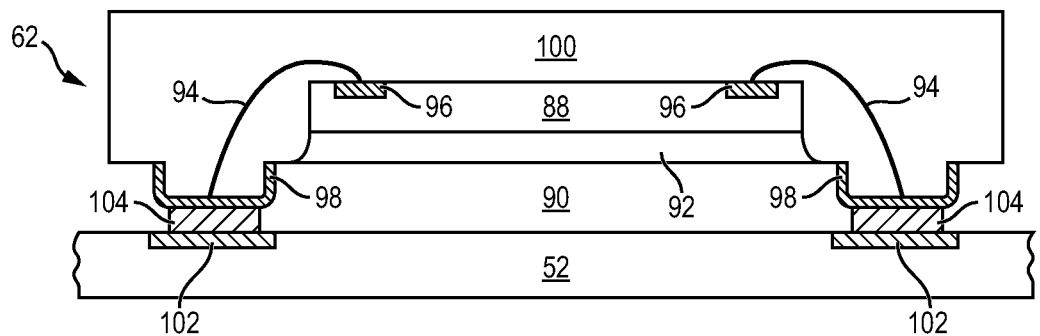
Figure 2C:
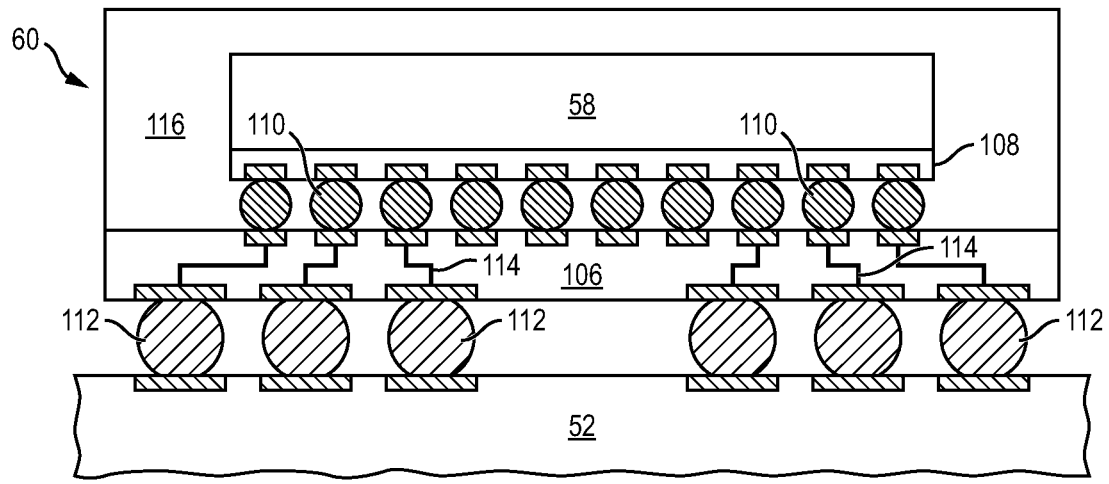

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

Figure 4:
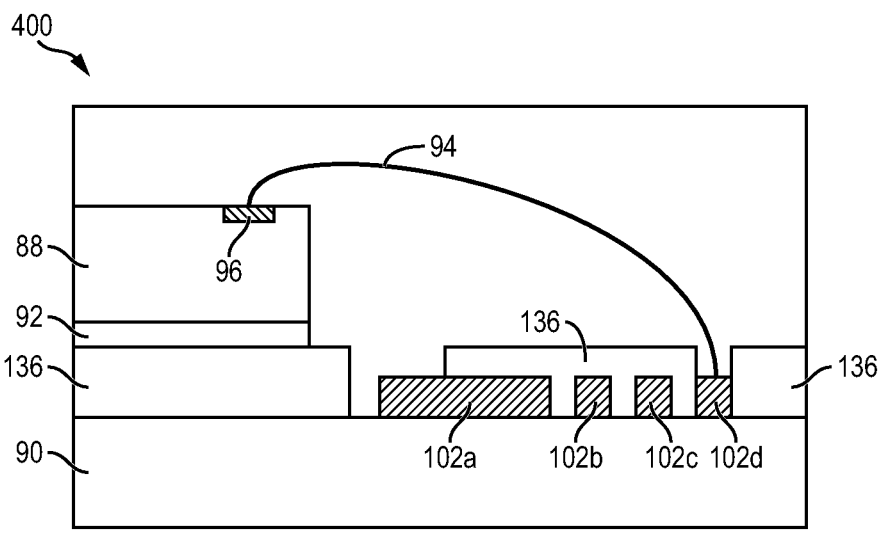
FIG. 4 is a semiconductor package having a conductive jumper trace known in the art.

FIG. 4 is a semiconductor package 400 having a conductive jumper trace known in the art. In this package 400, a semiconductor die or device 88 can be mounted over a carrier or substrate 90 via an adhesive 92 similar to that described above. The semiconductor device 88 can be attached directly to the substrate 90 or to the substrate via a dielectric layer or solder resist 136. The semiconductor device 88 includes a top contact pad 96 that can be connected to various contact pads 102 on the surface of the substrate 90 via a bond wire 94. In this example, the surface of the substrate 90 includes at least four contact pads 102a, 102b, 102c, 102d although it is understood that there can be fewer or more contact pads 102 as necessary. The contact pads 102 can be protected by a covering layer 136 such as solder resist or dielectric material, which can protect or isolate the contact pads 102 as necessary. In this instance, each contact pad 102a, 102b, 102c, 102d can be isolated from one another. In these prior art semiconductor packages 400, forming conductive jumper traces using bond wires 94 can be challenging when the conductive jumper traces are required to traverse such a long distance. For instance, the bond wire 94 is required to jump across at least three other contact pads 102a, 102b, 102c in order to make electrical connection with the farthest contact pad 102d. Not only is there great costs associated with long bond wires 94, but reliability and throughput of the wiring process become challenging as more and more jumper bond wires 94 are required.

Figure 5:
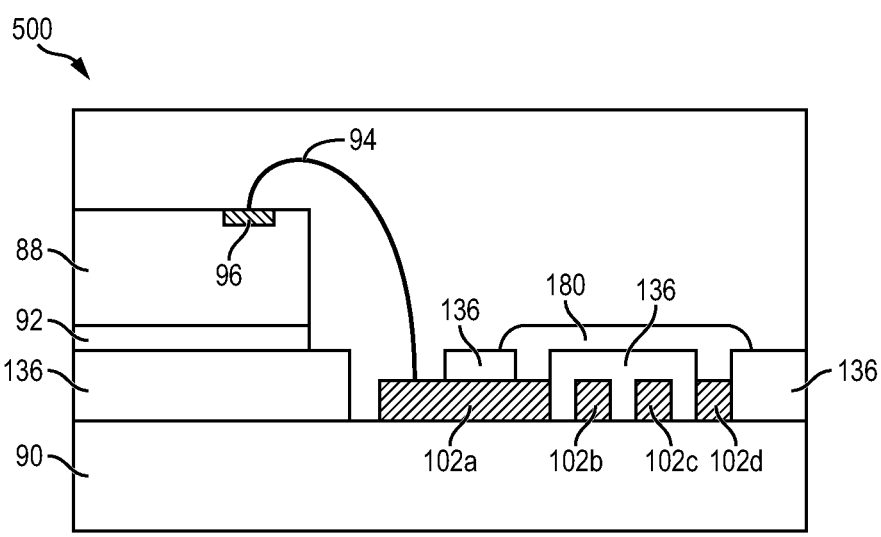
FIG. 5 is a semiconductor package having a conductive jumper trace according to one embodiment of the present disclosure.

FIG. 5 is a semiconductor package 500 having a conductive jumper trace according to one embodiment of the present disclosure. This example is substantially similar to that of the prior art with the exception that the bond wire 94 has been reduced according to the present disclosure. In some instance, the bond wire 94 may be completely eliminated. The reduction increases reliability and reduces costs associated with consuming long bond wire material.

In the currently disclosed semiconductor package 500, a semiconductor die or device 88 can be mounted over a carrier or substrate 90 with an adhesive 92 similar to that described above. The device 88 can be directly attached to the substrate 90 or on a solder resist layer 136. The semiconductor device 88 includes a top contact pad 96 that can be connected to various contact pads 102 on the surface of the substrate 90 via a bond wire 94. In this instance, the top contact pad 96 of the semiconductor device 88 is connected to the contact pad 102a closest to the semiconductor device 88. The next two contact pads 102b, 102c are insulated by a covering layer 136 such as solder resist or dielectric material. A conductive layer 180 can be conformally formed over the covering layer 136 to provide electrical connection between the closest contact pad 102a and the farthest contact pad 102d. The result is increased throughput and reliability as well as decreased cost with the conductive layer 180 serving or functioning as the conductive jumper trace.

The conductive layer 180 can be formed by a direct writing process including the likes of screen printing or electro-hydro dynamic (EHD) dispensing. Screen printing involves the use of a paste material, screen mesh, an emulsion material and application of force via an applicator with the substrate held by a nest. On the other hand, EHD dispensing involves the use of an electric field to dispense droplets from a nozzle. In one embodiment, formation of the conductive layer 180 includes the likes of inkjet printing technology, which can be continuous or on demand, and can be carried out in vertical or horizontal fashion. The use of inkjet printing to form the conductive layer 180 may provide visible and conductive metal lines that are halogen free. The ink material that is involved may be of an organic metal or a silver complex. The formation of the conductive layer 180 as well as the improved conductive jumper trace will be discussed in more detail below.

Figure 6A:
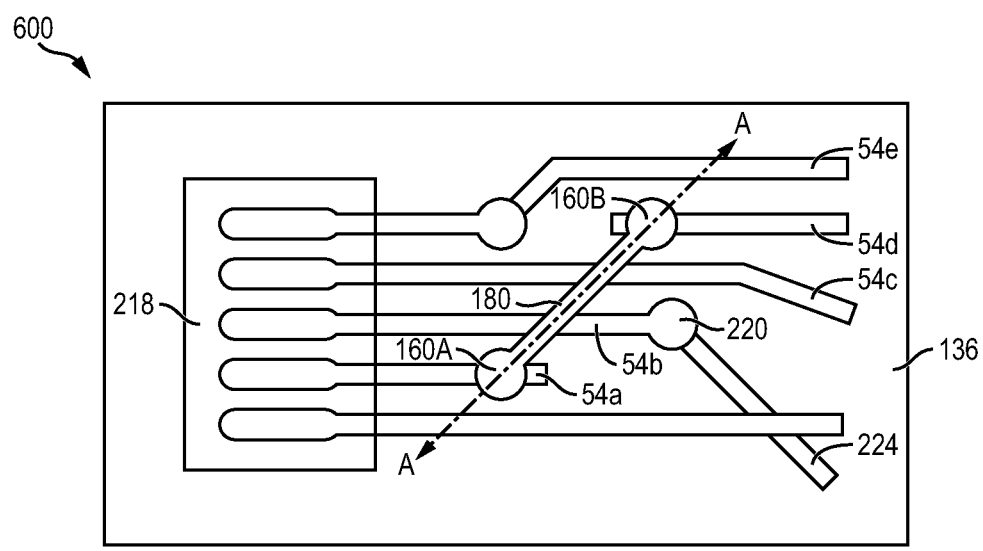
FIGS. 6A-6B are top-down and cross-sectional views of a semiconductor package having a conductive jumper trace according to one embodiment of the present disclosure.
Figure 6B:
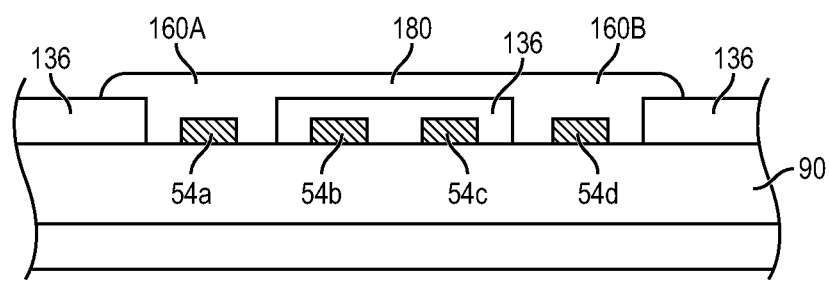

FIGS. 6A-6B are top-down and cross-sectional views of a semiconductor package 600 having a conductive jumper trace according to one embodiment of the present disclosure. FIG. 6A is a top-down view of the semiconductor package 600 while FIG. 6B is a cross-sectional view through A-A of the semiconductor package 600. As shown, the semiconductor package 600 includes a substrate 90 having a plurality of trace lines 54 formed thereon. The substrate 90 can be a semiconductor wafer or a chip carrier similar to those described above. After providing the substrate 90, trace lines 54 can be formed thereon by deposition or other processes as described above. In one embodiment, four trace lines 54a, 54b, 54c, 54d are formed over the substrate 90 although it is understood that there can be more or fewer trace lines 54 as necessary. In this embodiment, a first trace line 54b can be formed adjacent a fourth trace line 54c, where the first trace line 54b and the fourth trace line 54c are formed between the second trace line 54a and the third trace line 54d. In another embodiment, the fourth trace line 54c may not be necessary with the first trace line 54b between the second trace line 54a and the third trace line 54d, the three trace lines 54a, 54b, 54d formed over the substrate 90.

The first trace line 54b and the fourth trace line 54c can be electrically isolated from the second trace line 54a and the third trace line 54d by a covering layer 136 as best illustrated in FIG. 6B. Similarly, if only three trace lines 54 were present, the first trace line 54b can likewise be electrically isolated from the second trace line 54a and the third trace line 54d, also by a covering layer 136. The covering layer 136 can be an insulating layer or a protecting layer. The covering layer 136 can be dielectric material or solder resist. In some embodiments, the covering layer 136 can be an encapsulation material, an underfill or molding material such as an epoxy compound. In other embodiments, the covering layer 136 can also provide magnetic isolation or protection. The covering layer 136 can extend to other parts of the package 600.

When the first trace line 54b or the first trace line 54b and the fourth trace line 54c have been electrically isolated or insulated, a conductive layer 180 can be formed between the second trace line 54a and the third trace line 54d by an inkjet deposition (e.g., printing) process. In other embodiments, the conductive layer 180 can be formed by screen printing or EHD dispensing. This conductive layer 180 can serve as a conductive jumper trace by providing electrical connection between the second trace line 54a and the third trace line 54d. The inkjet deposition process involves depositing a conductive material, dispersing or allowing conductive material to disperse, and heating or curing of the conductive material to solidify the conductive material. In the alternative, the screen printing or EHD dispensing processes include depositing a conductive material having a first material state, where the first material state includes liquid, viscous or paste form. The conductive liquid or paste need not go through the dispersion or spreading process but instead can be heated from the first material state to a second material state, where the second material state is different from the first material state. The second material state may include solid, crystal or sintered form. In some embodiments, the first material state may have an initial profile while the second material state may have a final profile where the final profile is different from the initial profile. The difference in the profile may be a result of the heating or curing process which may drive out the fluid or viscous material in the liquid or paste causing the conductive material to undergo shrinkage into a more solid or sintered form.

The conductive layer 180, formed of the conductive material in ink, paste, or liquid form, can be conformally formed over the covering layer 136. In other words, the conductive material is able to follow the shape or contour of the covering layer 136 including any angles and crevices thereof, and fill in any of such openings or recesses as necessary in forming the conductive layer 180. In some embodiments, terminal openings 160A, 160B may be formed about the ends of the conductive layer 180 to ensure conformity and reliability of the conductive material. These terminal openings 160A, 160B may be formed as solder mask openings similar to the solder mask opening 218 for the terminal ends of the trace lines 54. In other embodiments, the package 600 may include through-silicon vias (TSVs) or backside vias 220 and backside trace lines 224 allowing electrical connections to be made to the other side of the substrate 90. The step-by-step detail of forming the semiconductor package 600 having the conductive jumper trace will become more apparent in subsequent figures and discussion.

Figure 7A:
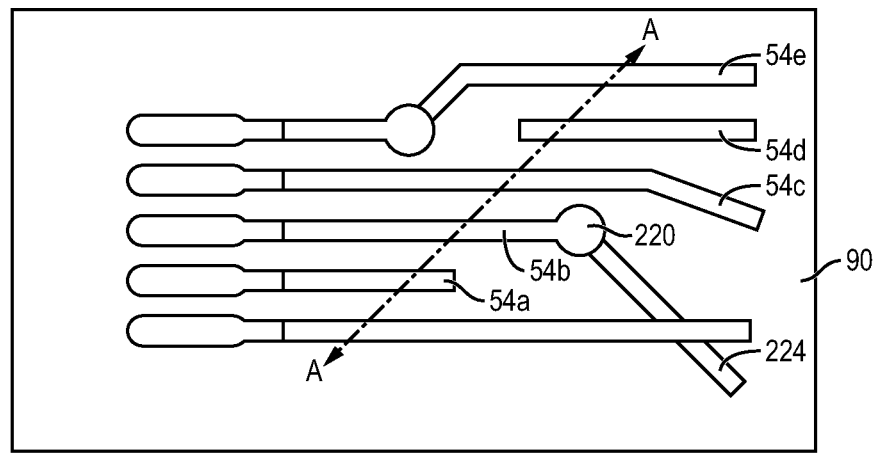
Figure 7B:
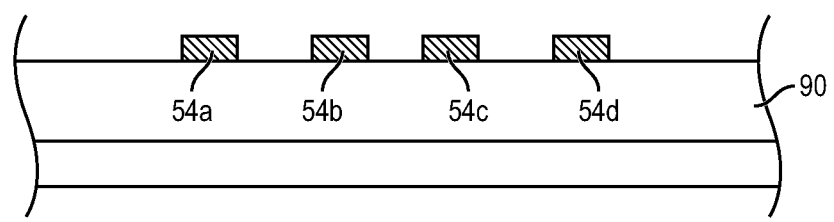

FIGS. 7A-7B to 10A-10B are top-down and cross-sectional views of a process flow for forming the semiconductor package 600 of FIGS. 6A-6B. FIG. 7A is a top-down view of a substrate 90 having a plurality of trace lines 54 formed thereon while FIG. 7B is a cross-sectional view through A-A of the substrate 90 and the trace lines 54. Like above, the substrate 90 can be a semiconductor wafer or a chip carrier, where trace lines 54 can be formed over the substrate 90 by the deposition processes described above. In one embodiment, four trace lines 54a, 54b, 54c, 54d can be formed over the substrate 90 where a first trace line 54b is formed adjacent a fourth trace line 54c, where the first trace line 54b and the fourth trace line 54c are in between the second trace line 54a and the third trace line 54d. In another embodiment, three trace lines 54a, 54b, 54d are formed over the substrate 90 where a first trace line 54b is formed between the second trace line 54a and the third trace line 54d. Backside traces 224 and backside vias 220 can be formed on the opposite side of the substrate 90. In other words, backside traces 224 and backside vias 220 can be formed on the side opposite the trace lines 54 (not shown in the cross-sectional view of FIG. 7B). For example, the first trace line 54b can be routed to the backside of the substrate 90 through the backside via 220 and the backside trace line 224 at a terminal end of the first trace line 54b as best illustrated in FIG. 7A.

Figure 8A:
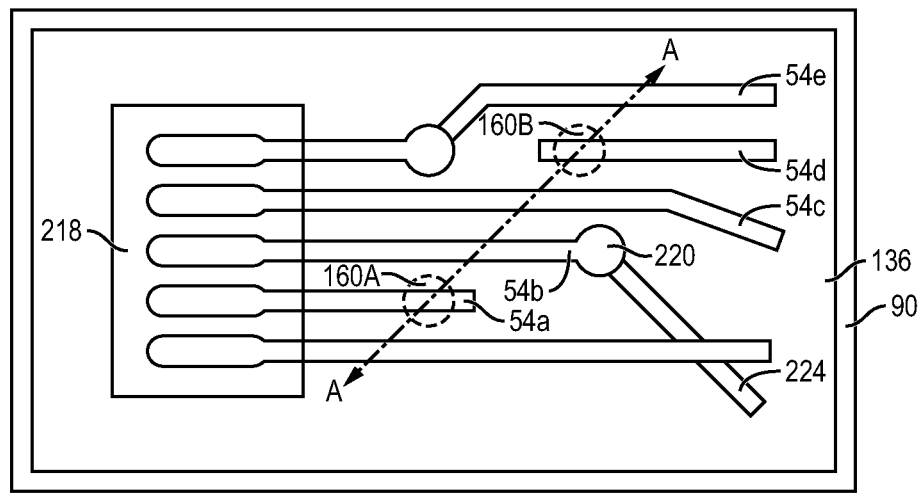
Figure 8B:
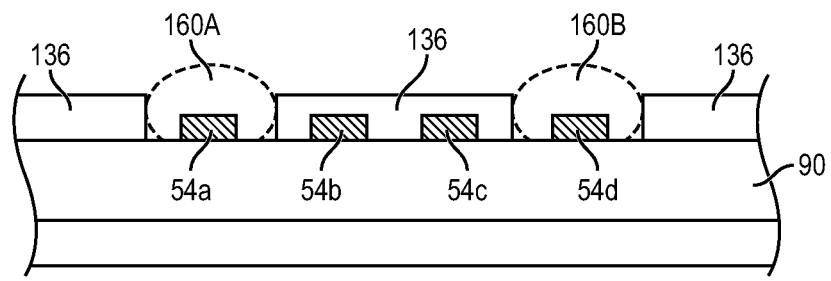

FIG. 8A is a top-down view of FIG. 7A having a covering layer 136 formed thereon while FIG. 8B is a cross-sectional view through A-A of FIG. 8A. As shown, the covering layer 136 can be formed over the trace lines 54. In one embodiment, the covering layer 136 is shown to be insulating or isolating the first trace line 54b and the fourth trace line 54c although it is understood that the covering layer 136 can also insulate or isolate only the first trace line 54b. In some embodiments, although the covering layer 136 is shown isolating the entire trace line 54b, 54c, it is also possible that the covering layer 136 need only isolate portions of the trace line 54b, 54c as necessary. Specifically, portion of the trace line 54b, 54c which will come into contact with the conductive material 180 may be isolated so as to prevent shorting across the trace lines 54. In other embodiments, the covering layer 136 may isolate portions of the second trace line 54a and the third trace line 54d although this need not be the case. In other words, the covering layer 136 need not extend the size of the substrate 90 but can be limited to only the relevant portions of the first trace line 54b and/or the fourth trace line 54c in between the second trace line 54a and the third trace line 54d.

The covering layer 136, as discussed above, can be formed of dielectric material or solder resist. The solder resist may be formed by deposition and photolithography, among other suitable techniques. Likewise, a dielectric material can be formed by deposition, lithography and etching to arrive at the desired pattern. The covering layer 136 may also be an encapsulation material such as underfill or molding compound including, for example, epoxy molding compound. The covering layer 136 helps to facilitate formation of the conductive layer 180 as will become more apparent in subsequent figures and discussion. In some embodiments, the covering layer 136 can be formed at the same time as the solder mask opening 218 for the terminal ends of the trace lines 54 as well as the terminal openings 160A, 160B for the electrical connections between the second trace line 54a and the third trace line 54d.

Figure 9A:
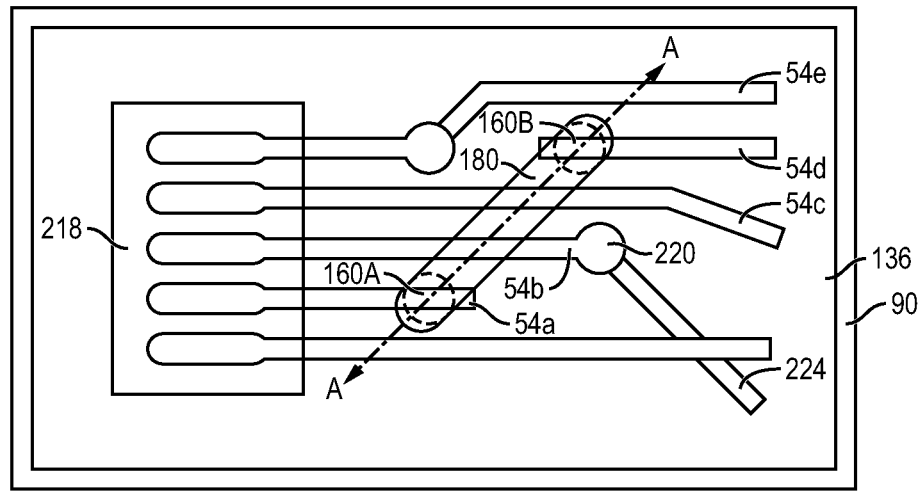
Figure 9B:
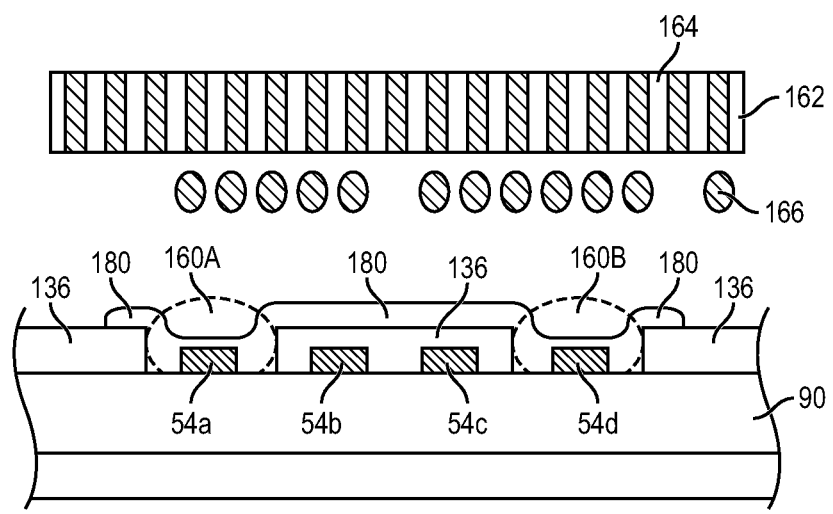

FIG. 9A is a top-down view of FIG. 8A showing the beginning steps of forming a conductive layer 180 and FIG. 9B is a cross-sectional view through A-A of FIG. 9A. As shown, after forming the covering layer 136 over the first trace line 54b and/or the fourth trace line 54c, a conductive material for forming a conductive layer 180 can be deposited and formed thereon to provide electrical connection between the second trace line 54a and the third trace line 54d. By using the covering layer 136 as an insulator, the subsequently formed conductive layer 180 is able to serve its function as a conductive jumper trace that jumps or hops across one or more trace lines 54.

As discussed above, the conductive layer 180 can be formed over the covering layer 136 electrically connecting the trace lines 54a, 54d via an inkjet printing process. The formation of the conductive material for the conductive layer 180 starts with an inkjet head 162, which may be provided over the desired area of interest. The inkjet head 162 can deliver a resolution of 1,200 dots per inch (DPI)

although other inkjet heads 162 with other resolution may be utilized. Upon passing over the desired area, a nozzle 164 from the inkjet head 162 may cause inkjet droplets 166 to be deposited onto the covering layer 136. The inkjet droplets 166 may also be deposited or dropped into the terminal openings 160A, 160B as well as adjacent the second trace line 54a and the third trace line 54d. The inkjet droplets 166 may also be deposited over the covering layer 136 forming a path that connects the second trace line 54a and the third trace line 54d. The inkjet droplets 166, containing an ink material, may subsequently be formed into the desired conductive layer 180. In this example, the deposition can be accomplished via gravity. In other instances, the deposition can be carried out via other suitable mechanical and/or electrical assistance including the likes of an electric field, for example.

The number of nozzles 164 on the inkjet head 162 can vary. For example, there can be a total of 2,048 nozzles 164 providing a coverage width of about 43 millimeters. The nozzles 164 and the head 162 may have a writing speed of about 200 millimeters per second. The number of droplets 166 can be varied depending on the desired thickness and/or width of the conductive material 180 to be achieved. For example, the number of droplets 166 can vary between about 1 droplet to about 10 droplets, or greater than 10 droplets 166. The inkjet droplet 166 may have a diameter of anywhere from about 3 microns to about 12 microns depending on the viscosity and the volume of the ink being consumed. Meanwhile, the thickness of the conductive layer 180 formed may be about 3 microns thick, or thinner than 3 microns, or thicker than 3 microns. In this instance, the amount of ink can be about 1 picoliter. Because of the plurality of nozzles 164 and the speed at which the head 162 can process a substrate, inkjet printing throughput can be on the matter of seconds per strip of devices.

In one embodiment, the inkjet droplet 166 may be a conductive material 180 in ink or liquid form. The types of conductive material 180 that can be in liquid or ink form include silver (Ag), platinum (Pt), gold (Au), copper (Cu), carbon nanotube (CNT), graphene, organic metal, or mixtures thereof. In another embodiment, the inkjet droplet 166 that ultimately forms the conductive layer 180 may be a conductive polymeric material with metallic properties.

In another embodiment, instead of using inkjet printing and inkjet droplet 166, conductive material 180 may be deposited in paste form and that deposition can be made by screen printing or EHD dispensing. The paste may have material properties similar to the inkjet droplet 166 disclosed above including without limitation silver (Ag) paste, platinum (Pt) paste, gold (Au) paste or copper (Cu) paste, to name a few.

In one embodiment, prior to the depositing or dropping of the inkjet droplet 166 step as shown in FIG. 9B, the surfaces of the substrate 90 including that of the covering layer 136 and the trace lines 54a, 54d in the terminal openings 160A, 160B may be treated with a hydrophilic plasma process. Treating the covering layer 136 and the trace lines 54a, 54d in the terminal openings 160A, 160B with hydrophilic plasma may raise the surface energy of the covering layer 136 and the trace lines 54a, 54d in the terminal openings 160A, 160B leading to increased spreading out of the conductive ink.

After the inkjet droplets 166 have been sitting on the covering layer 136 and pooling about the terminal openings 160A, 160B, the droplets 166 may begin to disperse or spread out. Because of the low viscosity (<100 centipoise), the inkjet droplet 166 is able to spread out to cover the desired surface area. For example, the inkjet droplet 166 may have an initial area upon deposition. Over time, the inkjet droplet 166 may disperse or be allowed to disperse thereby arriving at a final area. In one embodiment, the final area may be greater than the initial area. In another embodiment, the final area may be configured by the terminal openings 160A, 160B. In other words, the terminal openings 160A, 160B may serve as the pool or deep end of the pool thereby pooling or allowing the droplets 166 to pool around the terminal openings 160A, 160B. This can be best illustrated in FIG. 10B and will be discussed further below. The dispersion process of the droplets 166 may be further enhanced if the covering layer 136 and the trace lines 54a, 54d in the terminal openings 160A, 160B had been subjected to the hydrophilic plasma process as discussed above, which helps to raise the surface energy and enhance the dispersion process.

In another embodiment, if the screen printing or EHD dispensing is utilized, no dispersion step would be necessary as the desired profile may be formed after the deposition step.

After deposition and optional dispersion of the conductive material 180, a heating process may be carried out to further sinter the material. In one embodiment, the heating process may include oven or ultra-violet curing or both. The heating process may also include a reflow process for purposes of sintering the conductive particles that are in the conductive ink or paste material 180. Once heated or cured, the conductive material 180, formed over the covering layer 136, may serve to provide electrical connection between the second trace line 54a and the third trace line 54d.

FIGS. 10A-10B are the top-down and cross-sectional views of the semiconductor package 600 of FIGS. 6A-6B with a conductive layer as a conductive jumper trace according to one embodiment of the present disclosure. FIG. 10A is a top-down view while FIG. 10B is a cross-sectional view through A-A of FIG. 10A. FIGS. 10A-10B are substantially similar to that of FIGS. 9A-9B except that the inkjet droplets 166 have completely filled the terminal openings 160A, 160B and are confined to the desired layout (e.g., shape and size) of the conductive layer 180. Once the deposited droplets 166 or conductive material 180 have achieved the desired dispersion, if necessary, the conductive material 180 may be heated or cured as discussed above to arrive at the targeted conductive layer 180. Although shown to have an elongated cylindrical structure from the top view, the conductive layer 180 can take on any polygonal shape as necessary. In addition, the conductive layer 180 can substantially conform to the shape or outline of the structures underneath. In some embodiments, the conductive layer 180 can conform to the shape of the covering layer 136 as well as the shape of the trace lines 54a, 54d. In this example, both the covering layer 136 and the trace lines 54a, 54d have substantially rectangular cross-sectional shapes although it is understood that because of the depositing and dispensing process in liquid or paste form, the conductive layer 180 can contour to any shapes including without limitation circular, spherical or square.

In one embodiment, an integrated circuit die 88 can be mounted over the substrate 90 adjacent the solder mask opening 218 similar to that shown in FIG. 5. In this example, the integrated circuit die 88 can be attached to the covering layer 136 like a solder resist with an adhesive 92. The solder mask opening 218 can include contact pads 102 which are in electrical communication with the trace lines 54. In one example, the integrated circuit die 88 can be adjacent to and electrically coupled to the second trace line 54a. In another example, the integrated circuit die 88 can be adjacent to and electrically coupled to the third trace line 54*d*. In some embodiments, the integrated circuit die 88 can be connected to at least one of the second trace line 54*a* or the third trace line 54*d* with a connective material 94. In one example, the connective material 94 includes a bond wire which can extend from the contact pad 96 of the integrated circuit die 88 to the contact pad 102 within the solder mask opening 218, the contact pad 102 being in electrical communication with the trace lines 54.

In one embodiment, the integrated circuit die 88 can be connected to at least one of the second trace line 54*a* or the third trace line 54*d* with a connective material 94. In some embodiments, the connective material 94 can be an interconnect structure such as a metal line or solder bump. The connectivity allows the integrated circuit die 88 to be in communication with at least one of the second trace line 54*a* or the third trace line 54*d*. More specifically, the connectivity allows the integrated circuit die 88 to be in communication with both trace lines 54*a*, 54*d* even though the integrated circuit die 88 is only directly connected to one of the trace lines 54*a*, 54*d*. In other words, if the integrated circuit die 88 is mounted over the substrate 90 adjacent to and connected to the second trace line 54*a* with a connective material 94 or an interconnect structure 94, the conductive jumper trace or conductive layer 180 allows the integrated circuit die 88 to also be in communication with the third trace line 54*d*. The additional connectivity is provided by the conductive layer 180 which jumps over the trace lines 54*b*, 54*c* without shorting all trace lines 54. In the alternative, if the integrated circuit die 88 is mounted over the substrate 90 adjacent to and connected to the third trace line 54*d* with a connective material 94 or an interconnect structure 94, the conductive jumper trace or conductive layer 180 allows the integrated circuit die 88 to also be in communication with the second trace line 54*a*.

Although the mounting and connecting of the integrated circuit die 88 are discussed toward the end of the processes in FIGS. 10A-10B, the mounting and connecting of the integrated circuit die 88 can be performed earlier in the processing steps. In one example, the mounting and connecting of the integrated circuit die 88 can take place after the forming of trace lines 54 in FIGS. 7A-7B. In another example, the mounting and connecting of the integrated circuit die 88 can take place before the forming of the covering layer 136 in FIGS. 8A-8B. In some embodiments, the covering layer 136 may also cover portions of the integrated circuit die 88, if such integrated circuit die 88 was mounted over the substrate 106 before the formation of the covering layer 136. In yet another embodiment, the mounting and connecting of the integrated circuit die 88 can take place at the same time as the forming of trace lines 54 in FIGS. 7A-7B. In other words, the integrated circuit die 88 can be optionally mounted over the substrate 106 before the trace lines 54 are formed, or the integrated circuit die 88 can be connected to the trace lines 54 at the same time as the trace lines 54 are formed or shortly thereafter.

Figure 11A:
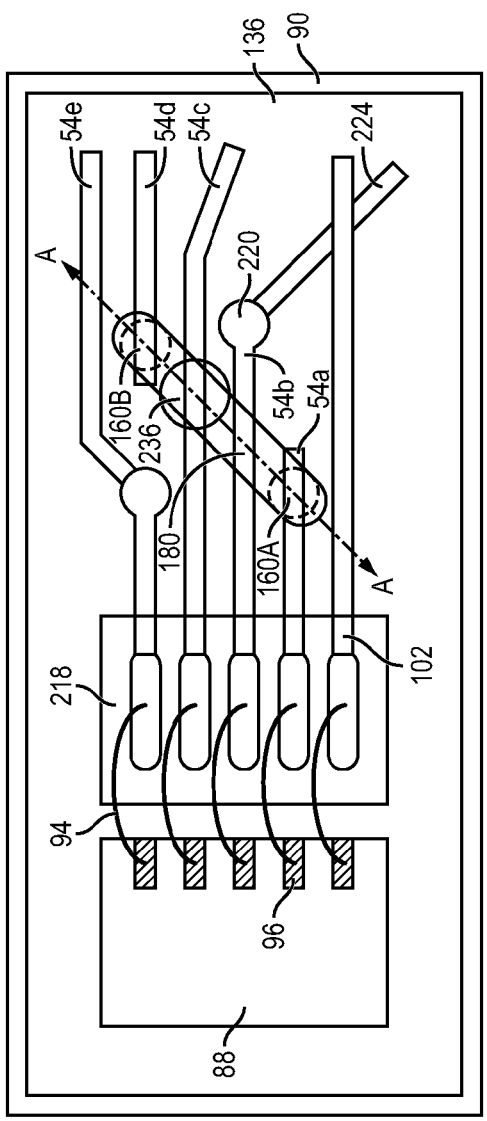
Figure 11B:
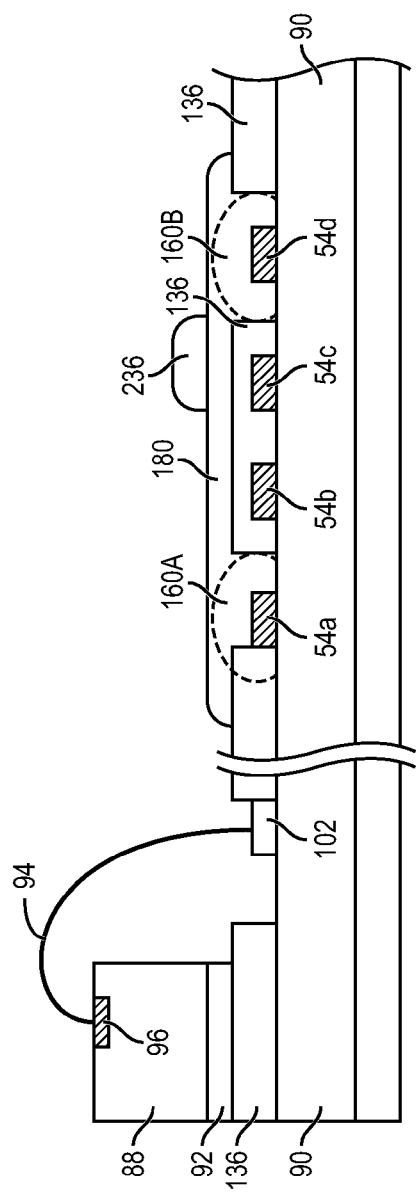

FIGS. 11A-11B to 12A-12B are top-down and cross-sectional views of a process flow for forming a semiconductor package 700 having a conductive jumper trace according to one embodiment of the present disclosure. FIGS. 11A-11B are continued from those of FIGS. 10A-10B where FIG. 11A is a top-down view while FIG. 11B is a cross-sectional view through A-A of FIG. 11A.

As shown in the cross-sectional view of FIG. 11B, trace lines 54 formed over the substrate 90 can be isolated with a covering layer 136. Specifically, the two inner trace lines 54*b*, 54*c* can be isolated with a first covering layer 136. Although shown to include two trace lines 54*b*, 54*c*, it is understood that the first covering layer 136 need only isolate or insulate one trace line (54*b* or 54*c*). Next, a first conductive layer 180 can be formed over the first covering layer 136 as shown and discussed above and in the earlier figures.

In general, formation of the first conductive layer 180 over the first covering layer 136 includes depositing the conductive material 180, optionally allowing the conductive material 180 to disperse from an initial area to a final area, where the final area is greater than the initial area, and heating or curing the conductive material into a solid form. In the alternative, if screen printing or EHD dispensing is utilized, the conductive liquid or paste may be deposited having a first material state, where the first material state includes liquid, viscous or paste form. The conductive liquid or paste need not go through the dispersion or spreading process but instead can be heated from the first material state to a second material state, where the second material state is different from the first material state. The second material state may include solid, crystal or sintered form. In some embodiments, the first state may have an initial profile while the second state may have a final profile where the final profile is different from the initial profile. The difference in the profile may be a result of the heating or curing process which may drive out the fluid or viscous material in the liquid or paste causing the conductive material to undergo shrinkage into a more solid or sintered form.

The conductive ink, paste or liquid used in the formation of the conductive material 180 may include silver (Ag) complexes, platinum (Pt) complexes, gold (Au) complexes, copper (Cu) complexes, carbon nanotube (CNT), graphene, organic metal, or additives and mixtures thereof. The conductive ink, paste or liquid may also be an organic polymer with metallic properties. In some embodiments, the covering layer 136 may be treated with hydrophilic plasma prior to deposition of the conductive material 180 to enhance the dispersing process, as necessary.

Next, a portion of the first conductive layer 180 can be isolated with a second covering layer 236, the second covering layer 236 being formed in a similar manner with similar material as that of the first covering layer 136, and other insulating or protective material described above. Although the second covering layer 236 as shown is substantially over the first covering layer 136 and more specifically limited to that of the fourth trace line 54*c*, it is understood that the second covering layer 236 can take on any shape or size as necessary to isolate or prevent shorting of the first conductive layer 180 to any portions of the trace lines 54 not meant to be electrically connected thereto.

FIGS. 12A-12B are top-down and cross-sectional views of a semiconductor package 700 having two conductive layers or dual conductive jumper traces according to one embodiment of the present disclosure. FIGS. 12A-12B are continued from those of FIGS. 11A-11B where FIG. 12A is a top-down view while FIG. 12B is a cross-sectional view through A-A of FIG. 12A. After the second covering layer 236 has been formed over and isolating a portion of the first conductive layer 180, a second conductive layer 280 may subsequently be formed over the second covering layer 236. The second conductive layer 280 may be formed with similar manner/material as that of the first conductive layer 180, or with other conductive materials as described above. During the formation process of the second conductive layer 280, terminal openings 260A, 260B may be formed on trace lines 54 to limit or provide a relief region for the second conductive material 280 to accumulate similar to that described above for the terminal openings 160A, 160B. In some instances, the terminal openings 160, 260 may also be referred to as via openings or recesses or trench formations.

In one embodiment, the second conductive layer 280 can be formed by depositing the second conductive layer 280, optionally dispersing the second conductive layer 280, and heating the second conductive layer 280. Once formed, the second conductive layer 280 can conform to the second covering layer 236 similar to that of the first conductive layer 180 conforming to the first covering layer 136. In this instance, the second conductive layer 280 is able to provide electrical connection between the first trace line 54b and a fifth trace line 54e. Although electrical connection is shown to be made to the fifth trace line 54e by the second conductive layer 280, the second conductive layer 280 can also provide electrical connection to any isolated portions of the other trace lines 54a, 54b, 54c, 54d so long as electrical connection is desired. In other words, although the second conductive layer 280 as shown connects the fifth trace line 54e to the first trace line 54b, the second conductive layer 280 can also connect the fifth trace line 54e to either the second trace line 54b or the third trace line 54c or both trace lines 54b, 54c as necessary. In some embodiments, the second conductive layer 280 need not connect the first trace line 54b and the fifth trace line 54e but instead can connect the first trace line 54b to the second trace line 54a or the third trace line 54b or the fourth trace line 54c or any combinations thereof.

In some embodiments, the second conductive layer 280 can connect the fifth trace line 54e to three trace lines 54b, 54a, 54d. In other embodiments, the second conductive layer 280 can make a variety of electrical connections as necessary and desired, and that such connections can take place between two trace lines or among three or more trace lines as necessary. In these instances, the trace lines 54 need not be continuous (e.g., fifth trace line 54e and the third trace line 54d appear to be aligned with a break in between). The same behavior or connection trend may also go for that of the first conductive layer 180. Furthermore, the covering layers 136, 236 can come in a variety of sizes and shapes and need not be circular or spherical as shown in the figures as long as it is capable of covering or protecting a portion or all of the trace lines 54 to prevent undesired shorting.

Figure 13:
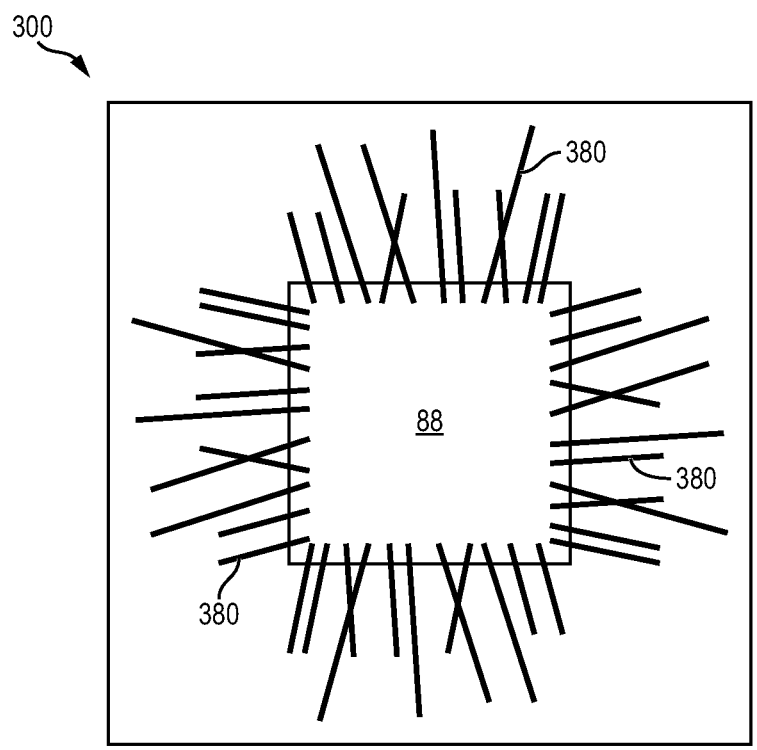
FIG. 13 is a top-down view of a semiconductor package having conductive jumper traces known in the art.

FIG. 13 is a top-down view of a prior art semiconductor package 300 having conductive jumper traces known in the art. In this package 300, the integrated circuit die 88 can be mounted about a center of the package 300 with a plurality of cross-wire bonds 380 serving as the conductive jumper traces. As discussed herein, such wire bonds 380 may require extensive length of wire bonds leading to added cost as well as slow throughput due to having to form each wire bond 380 individually for making the conductive jumper trace. Furthermore, bond wire reliability can also become a concern as bond lengths increase and the number of bond wires increase.

Figure 14:
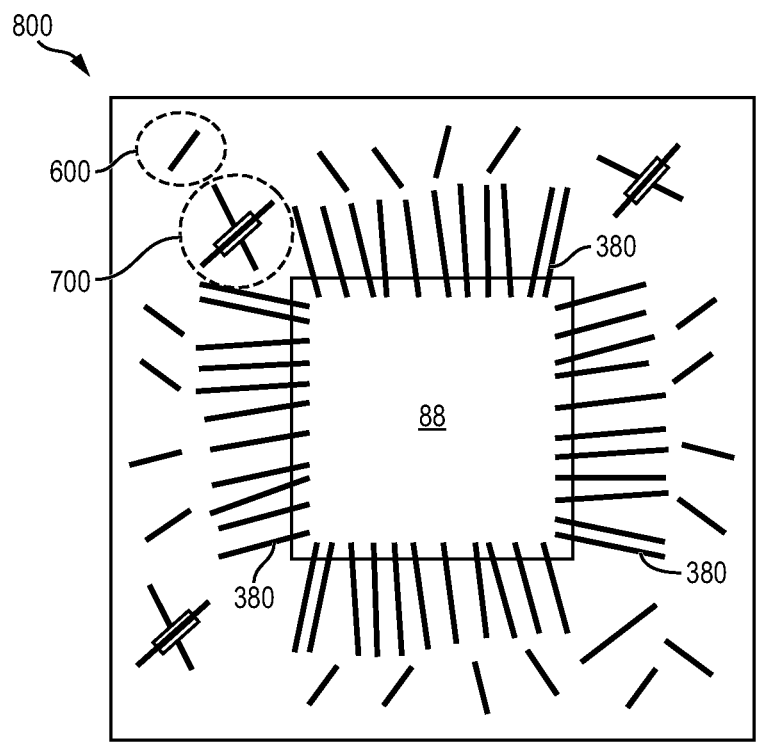
FIG. 14 is a top-down view of a semiconductor package having conductive jumper traces according to one embodiment of the present disclosure.

FIG. 14 is a top-down view of a semiconductor package 800 having conductive jumper traces according to one embodiment of the present disclosure. In one embodiment, the integrated circuit die 88 can be mounted about a center of the package 800. However, in this instance, cross-wire bonds 380 can be eliminated with the use of dual conductive jumper traces according to the semiconductor package 700 shown in FIGS. 12A-12B. Furthermore, single conductive jumper traces according to the semiconductor packages 600 shown in FIGS. 10A-10B can also be utilized resulting in a semiconductor package 800 having mostly straight-forward (e.g., no crossing over or jumping over) and short wire bonds 380. The result is that wire bonds 380 need not cross over nor do they need to function as jumper traces extending a long distance or travel path. The currently disclosed embodiments can achieve cost savings as well as increased reliability and throughput of the semiconductor packaging processes.

Figure 15:
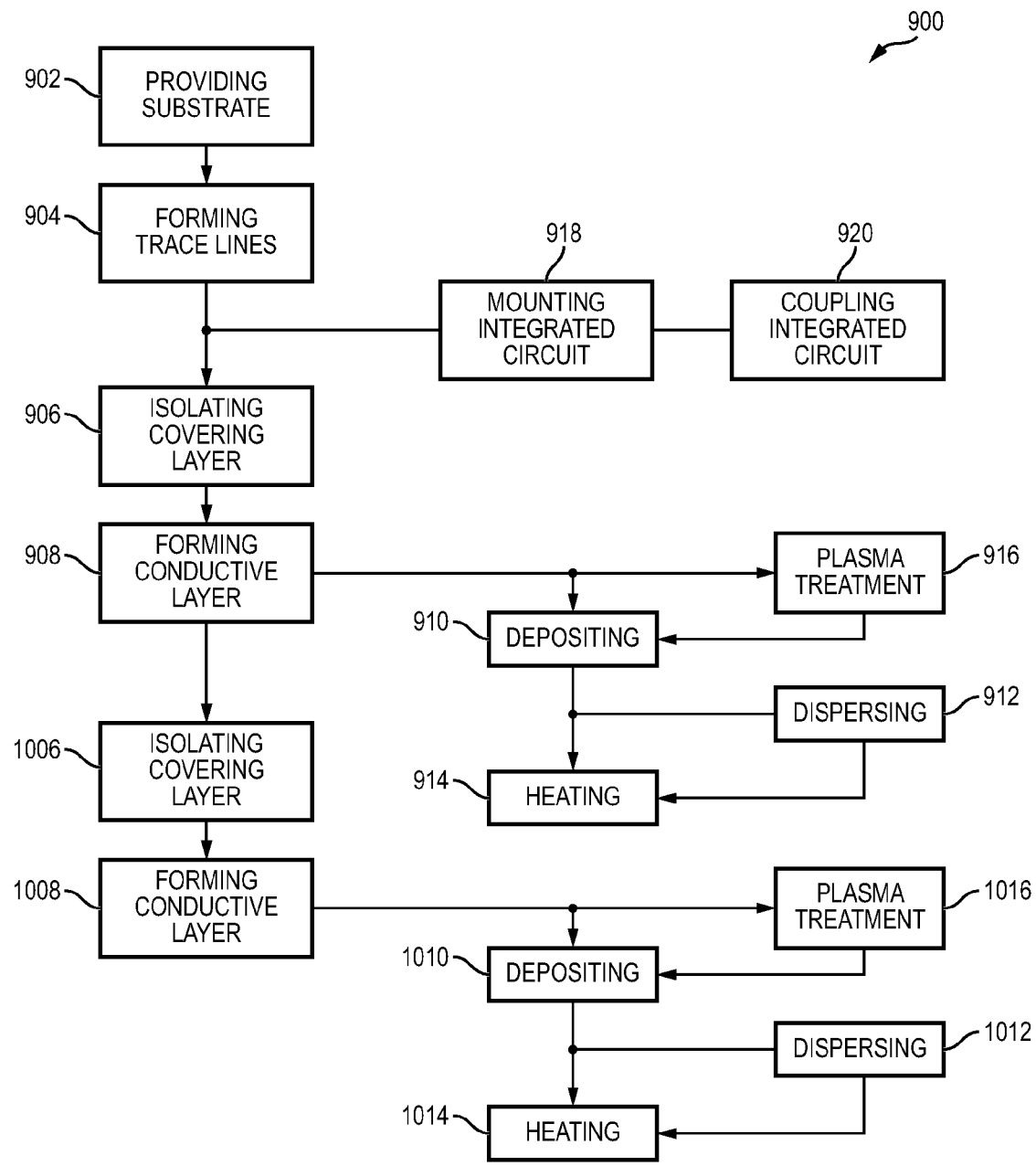
FIG. 15 is a flow diagram of methods of forming conductive jumper traces on semiconductor packages.

FIG. 15 is a flow diagram 900 of the methods of forming conductive jumper traces in semiconductor devices and packages. In one embodiment, a method of forming conductive jumper traces for semiconductor packages includes providing a substrate as indicated in step 902. Next, a plurality of trace lines can be formed over the substrate including forming first, second and third trace lines, where the first trace line is between the second trace line and the third trace line in step 904. In some embodiments, four or more trace lines can be formed in step 904. Next, a first trace line can be isolated with a covering layer in step 906. Electrical connection can be made between the second trace line and the third trace line by forming a conductive layer (e.g., jumper trace) in step 908. The conductive layer can be formed by depositing the conductive layer (910), where the conductive layer includes at least one of silver (Ag), platinum (Pt), gold (Au), copper (Cu), carbon nanotube (CNT), graphene, organic metal, or mixtures thereof. Optionally, the conductive layer can disperse or be allowed to disperse or spread such that the conductive layer conforms to the covering layer (912). In one embodiment, to enhance the dispersion step, the trace lines may be treated with hydrophilic plasma 916 prior to the depositing and dispersing steps 910, 912. Last but not least, the conductive layer can be heated or cured in a heating step (914) to solidify the conductive layer thus allowing the conductive layer to provide electrical connection between the second trace line and the third trace line.

In one embodiment, the depositing step 910 can be done such that the conductive material is at a first material state. The first material state includes liquid, viscous or paste form, among others. The first material state may also include an initial or first profile. Subsequently, the heating step 914 can be performed to alter or transform the conductive material from the first material state to a second material state, where the second material state is different from the first material state. The second material state includes solid, crystal or sintered form, among others. The second material state may also include a final or second profile, the final or second profile being different from the initial or first profile. This may be as a result of the heating step 914 which may cause shrinkage of the conductive ink, droplet, liquid or paste. Regardless, the conductive material can be formed without a lithographic process involving the coating and removal of a photoresist material. Furthermore, the conductive material can be formed without the use of a traditional metallization process in which the material is deposited and formed as is.

In one embodiment, during the forming trace lines step 904, a fourth trace line can be formed over the substrate, the fourth trace line being adjacent the first trace line. This fourth trace line can also be between the second trace line and the third trace line. Similarly, during the isolating covering layer step 906, the fourth trace line can also be isolated by the covering layer.

In one embodiment, after the forming trace lines step 904, an integrated circuit die can be mounted over the substrate in step 918. The integrated circuit die can be mounted adjacent to either the second trace line or the third trace line. Subsequently, the integrated circuit die can be coupled to either the second trace line or the third trace line with a connective material in step 920. For example, if the integrated circuit die is adjacent the second trace line, the integrated circuit die can be electrically coupled or connected to the second trace line with a bond wire or a suitable interconnect structure (e.g., metal line, solder bump). In the alternative, if the integrated circuit die is adjacent the third trace line, the integrated circuit die can be electrically coupled or connected to the third trace line with a bond wire or a suitable electrical interconnect structure. Because of the conductive jumper trace or conductive layer, by connecting the integrated circuit die to only either the second or third trace line will allow the integrated circuit die to be in communication with the other trace line that the integrated circuit die is not directly connected to. In other words, if the integrated circuit die is adjacent to and connected to the second trace line with an interconnect structure, the conductive jumper trace or conductive layer will allow the integrated circuit die to be in communication with the third trace line, and vice versa.

In another embodiment, although the mounting and connecting steps 918, 920 are shown to be performed after the forming step 904, in some embodiments, the mounting and connecting steps 918, 920 can be performed or carried out at the same time as the forming step 904.

In one embodiment, a method of forming conductive jumper traces for semiconductor packages includes providing a substrate as indicated in step 902. Next, a plurality of trace lines can be formed over the substrate including forming first, second, third and fourth trace lines, where the first trace line is adjacent the fourth trace line, and where both of these lines are between the second trace line and the third trace line in step 904. Next, the first trace line and the fourth trace line can be isolated with a covering layer in step 906. Electrical connection can be made between the second trace line and the third trace line by forming a conductive layer (e.g., jumper trace) in between in step 908. The conductive layer can be formed by depositing the conductive layer (910), where the conductive layer includes at least one of silver (Ag), platinum (Pt), gold (Au), copper (Cu), carbon nanotube (CNT), graphene, organic metal, or mixtures thereof. Optionally, the conductive layer can disperse or be allowed to disperse or spread such that the conductive layer conforms to the covering layer (912). In one embodiment, to enhance the dispersion step, the trace lines may be treated with hydrophilic plasma 916 prior to the depositing and dispersing steps 910, 912. Last but not least, the conductive layer can be heated or cured in a heating step (914) to solidify the conductive layer thus allowing the conductive layer to provide electrical connection between the second trace line and the third trace line.

In some embodiments, the conductive material or layer can be formed over the covering layer in step 908, the formation steps include: depositing the conductive material (910), optionally dispersing or allowing the conductive material to disperse from an initial area to a final area, where the final area is greater than the initial area (912), and heating of the conductive material (914).

Like above, in another embodiment, after the forming trace lines step 904, an integrated circuit die can be mounted over the substrate in step 918. The integrated circuit die can be amounted adjacent to either the second trace line or the third trace line. Subsequently, the integrated circuit die can be coupled to either the second trace line or the third trace line with a connective material in step 920. Because of the conductive jumper trace or conductive layer, by connecting the integrated circuit die to only either the second or third trace line will allow the integrated circuit die to be in communication with the other trace line that the integrated circuit die is not directly connected to. And like above, although the mounting and connecting steps 918, 920 are shown to be performed after the forming step 904, in some embodiments, the mounting and connecting steps 918, 920 can be performed or carried out at the same time as the forming step 904.

In one embodiment, a method of forming conductive jumper traces for semiconductor packages includes providing a substrate as indicated in step 902. Next, a plurality of trace lines can be formed over the substrate including forming first, second and third trace lines, where the first trace line is between the second trace line and the third trace line in step 904. Next, the first trace line can be isolated with a first covering layer in step 906. Electrical connection can be made between the second trace line and the third trace line by forming a first conductive layer (e.g., jumper trace) in between in step 908. The first conductive layer can be formed by depositing the first conductive layer (910), where the first conductive layer includes at least one of silver (Ag), platinum (Pt), gold (Au), copper (Cu), carbon nanotube (CNT), graphene, organic metal, or mixtures thereof. Optionally, the first conductive layer can disperse or be allowed to disperse or spread such that the first conductive layer conforms to the first covering layer (912). In one embodiment, to enhance the dispersion step, the trace lines can be treated with hydrophilic plasma 916 prior to the depositing and dispersing steps 910, 912. Last but not least, the first conductive layer can be heated or cured in a heating step (914) to solidify the first conductive layer thus allowing the first conductive layer to provide electrical connection between the second trace line and the third trace line.

In one embodiment, a portion of the first conductive layer can be isolated with a second covering layer in step 1006. The second covering layer can be formed of the same or similar material and in the same or similar manner as that of the first covering layer in step 906. After isolating a portion of the first conductive layer with a second covering layer in step 1006, a second conductive layer can be formed over the second covering layer in step 1008. The second conductive layer can be formed of the same or similar material and in the same or similar manner as that of the first conductive layer in step 908. For instance, the second conductive layer can be formed by depositing the second conductive layer (1010), where the second conductive layer includes at least one of silver (Ag), platinum (Pt), gold (Au), copper (Cu), carbon nanotube (CNT), graphene, organic metal, or mixtures thereof. Optionally, the second conductive layer can disperse or be allowed to disperse or spread such that the second conductive layer conforms to the second covering layer (1012). In one embodiment, to enhance the dispersion step, the second covering layer can be treated with hydrophilic plasma 1016 prior to the depositing and dispersing steps 1010, 1012. Last but not least, the second conductive layer can be heated or cured in a heating step (1014) to solidify the second conductive layer.

In one embodiment, the second conductive layer or material can be deposited over the second covering layer such that the second conductive layer is deposited as at a third material state during the depositing step 1010. The third material state may be similar to that of the first state to include liquid, viscous or paste form, among others. The third material state may also include a third profile, which can be substantially similar to that of the first or initial profile. Next, the second conductive layer can be heated at the heating step 1014 bypassing the dispersing step 1012 to transform the second conductive layer from the third material state to a fourth material state, where the fourth material state is different from the third material state. The fourth material state may be similar to that of the second material state to include solid, crystal or sintered form, among others. The fourth material state may also include a fourth profile, the fourth profile being different from the third profile but may be substantially similar to that of the final or second profile. Like with the first conductive layer, the second conductive layer can be formed without a lithographic process involving the coating and removal of a photoresist material. Furthermore, the second conductive layer can be formed without the use of a traditional metallization process in which the material is deposited and formed as is.

In one embodiment, the method includes forming a fourth trace line over the substrate and connecting the second conductive layer to the fourth trace line and at least one of the first trace line, the second trace line and the third trace line. In another embodiment, during the forming trace lines step 904, a fourth trace line can be formed over the substrate, the fourth trace line being adjacent the first trace line. This fourth trace line can also be between the second trace line and the third trace line. Similarly, during the isolating covering layer step 906, the fourth trace line can also be isolated by the covering layer.

Like above, in another embodiment, after the forming trace lines step 904, an integrated circuit die can be mounted over the substrate in step 918. The integrated circuit die can be amounted adjacent to either the second trace line or the third trace line. Subsequently, the integrated circuit die can be coupled to either the second trace line or the third trace line with a connective material in step 920. Because of the conductive jumper trace or conductive layer, by connecting the integrated circuit die to only either the second or third trace line will allow the integrated circuit die to be in communication with the other trace line that the integrated circuit die is not directly connected to. And like above, although the mounting and connecting steps 918, 920 are shown to be performed after the forming step 904, in some embodiments, the mounting and connecting steps 918, 920 can be performed or carried out at the same time as the forming step 904.

The currently disclosed embodiments are able to produce higher processing throughput by reducing the number of processing steps. In addition, wire bonding processes can be reduced or eliminated and cost savings can also be achieved as the amount of bond wires used can also be cut back. These embodiments may eliminate the use of cross-wires with insulations or coatings, especially in instances where long crossing wires may be required. Furthermore, yields of bond wires will improve as the bond wires can be made shorter and bond wire layouts can be simplified by removing long and/or crossed wires similar to that shown in FIG. 14. In some instances, the substrate pattern or design may also be relaxed. Furthermore, although one conductive jumper trace and two conductive jumper traces are shown, it is understood that there can be more conductive jumper traces as necessary without compromising the topography of the package.

Although the current description has been described in detail with reference to several embodiments, additional variations and modifications exist within the scope and spirit of the disclosure.

What is claimed is:

1. A method of making a semiconductor device, comprising:
   providing a substrate;
   disposing a semiconductor die on the substrate;
   forming a first conductive trace and second conductive trace on the substrate adjacent to the semiconductor die;
   forming a third conductive trace on the substrate between the first conductive trace and second conductive trace;
   forming a first insulating layer over the third conductive trace;
   forming a first conductive layer over the first insulating layer and electrically connected to the first conductive trace and second conductive trace;
   forming a bond wire extending from the semiconductor die to the first conductive trace, wherein the semiconductor die is electrically coupled to the second conductive trace by the bond wire, first conductive trace, and first conductive layer; and
   depositing an encapsulant over and around the semiconductor die, bond wire, first conductive trace, second conductive trace, third conductive trace, and first conductive layer.

2. The method of claim 1, further including forming the first conductive layer by inkjet printing, screen printing, or electro-hydro dynamic dispensing.

3. The method of claim 1, further including:
   forming a second insulating layer over the first conductive layer; and
   forming a second conductive layer over the second insulating layer.

4. The method of claim 1, further including:
   forming a first opening in the first insulating layer extending to the first conductive trace;
   forming a second opening in the first insulating layer extending to the second conductive trace; and
   forming the first conductive layer in the first opening and second opening.

5. The method of claim 1, further including treating the first insulating layer with a hydrophilic plasma before forming the first conductive layer.

6. A method of making a semiconductor device, comprising:
   providing a substrate;
   forming a first conductive trace and second conductive trace over the substrate;
   forming a bond wire extending to the first conductive trace;
   forming a first insulating layer between the first conductive trace and second conductive trace;
   forming a first conductive layer over the first insulating layer and coupled between the first conductive trace and second conductive trace; and
   depositing an encapsulant contacting the first conductive trace, second conductive trace and first conductive layer.

7. The method of claim 6, further including:
   disposing a semiconductor die over the substrate; and
   forming the bond wire extending from the semiconductor die to the first conductive trace.

8. The method of claim 6, further including forming the first conductive layer by inkjet printing, screen printing, or electro-hydro dynamic dispensing.

9. The method of claim 6, further including forming the first conductive layer to contact a first end of the first conductive trace and a second end of the second conductive trace.

10. The method of claim 6, further including:
    forming a second insulating layer over the first conductive layer; and forming a second conductive layer over the second insulating layer.

11. The method of claim 10, further including:
forming a third conductive trace electrically connected to the second conductive layer; and
forming a fourth conductive trace electrically connected to the second conductive layer.

12. The method of claim 6, further including treating the first insulating layer with a hydrophilic plasma before forming the first conductive layer.

13. A method of making a semiconductor device, comprising:
providing a substrate;
forming a first conductive trace over the substrate;
forming a bond wire extending to the first conductive trace;
forming a first insulating layer over the first conductive trace opposite the substrate; and
forming a first jumper trace extending to the first conductive trace and directly over the first insulating layer opposite the substrate.

14. The method of claim 13, further including:
forming a second conductive trace coupled to the first jumper trace; and
forming a third conductive trace between the first conductive trace and second conductive trace.

15. The method of claim 13, further including forming a second jumper trace over the first jumper trace.

16. The method of claim 13, further including forming the first jumper trace through an opening in the first insulating layer.

17. The method of claim 13, further including disposing a semiconductor die over the substrate with the bond wire extending to the semiconductor die.

18. The method of claim 13, further including forming the first jumper trace by inkjet printing, screen printing, or electro-hydro dynamic dispensing.

19. A method of making a semiconductor device, comprising:
providing a substrate;
forming a conductive trace over the substrate;
forming an insulating layer over the substrate and conductive trace and including a first opening and second opening in the insulating layer;
forming a first jumper trace coupled to the conductive trace through the first opening and extending to the second opening; and
depositing an encapsulant over and around the conductive trace and jumper trace.

20. The method of claim 19, further including forming a second jumper trace over the first jumper trace.

21. The method of claim 19, further including disposing a semiconductor die over the substrate.

22. The method of claim 19, further including treating the insulating layer with a hydrophilic plasma before forming the first jumper trace.

23. The method of claim 19, further including forming a bond wire extending to the conductive trace.

* * * * *